(12) United States Patent
Yamazaki

(10) Patent No.: US 7,741,180 B2
(45) Date of Patent: Jun. 22, 2010

(54) METHOD OF MANUFACTURING SEMICONDUCTOR DEVICE WITH RECESS GATE TRANSISTOR

(75) Inventor: Yasushi Yamazaki, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/314,303

(22) Filed: Dec. 8, 2008

(65) Prior Publication Data

US 2009/0148994 A1 Jun. 11, 2009

(30) Foreign Application Priority Data

Dec. 10, 2007 (JP) ............................ P2007-318959

(51) Int. Cl.
 *H01L 29/78* (2006.01)
(52) U.S. Cl. ................................. 438/270; 257/E29.27
(58) Field of Classification Search ................ 438/270, 438/259; 257/E29.27
 See application file for complete search history.

(56) References Cited

U.S. PATENT DOCUMENTS 7,247,541 B2 * 7/2007 Lee et al. .................... 438/286

FOREIGN PATENT DOCUMENTS

| JP | 06-005798 | 1/1994 |
| JP | 08-078682 | 3/1996 |
| JP | 10-050992 | 2/1998 |

OTHER PUBLICATIONS

J.Y. Kim et al., "The Breakthrough in data retention time of DRAM using Recess-Channel-Array Transistor (RCAT) for 88mm feature size and beyond", Digest of Technical Papers, Symposium on VLSI Technology., pp. 11-12, 2003.

* cited by examiner

*Primary Examiner*—W. David Coleman
*Assistant Examiner*—Daniel Shook
(74) *Attorney, Agent, or Firm*—McGinn IP Law Group, PLLC

(57) ABSTRACT

A method of manufacturing a semiconductor device includes forming a plurality of recesses in a semiconductor substrate, forming a gate insulating film in the plurality of recesses, and a plurality of gate electrodes on the gate insulating film in the plurality of recesses, forming an insulating layer on the semiconductor substrate and the plurality of gate electrodes, forming a plurality of contact holes in the insulating layer, the contact holes being formed between adjacent ones of the plurality of gate electrodes, implanting a first impurity into the semiconductor substrate through the plurality of contact holes to form each of source and drain regions in contact with the gate insulating film.

19 Claims, 11 Drawing Sheets

METHOD OF MANUFACTURING SEMICONDUCTOR DEVICE WITH RECESS GATE TRANSISTOR

CLAIM OF PRIORITY

Priority is claimed on Japanese Patent Application No. 2007-318959, filed Dec. 10, 2007, the content of which is incorporated herein by reference.

BACKGROUND OF THE INVENTION

1. Field of the Invention

The present invention relates to a method of manufacturing a semiconductor device having an insulated gate transistor of a recess gate type (called hereinafter "recess gate transistor" or "recess channel transistor").

2. Description of the Related Art

With the miniaturization of DRAM (dynamic random access memory) cells, recess gate transistors (recess channel transistors) have been invented to suppress the short channel effect of access transistors in a cell array (hereinafter, "cell transistors") (see, for example, J. Y. KIM et al., Symp. on VLSI Tech., p 11-12, 2003).

As shown in FIG. 5, in a semiconductor device H1 with a recess-gate transistor structure, one or more recess gate transistors are formed in an active region defined by a shallow trench isolation (STI) region 102.

Specifically, an N-type diffusion layer 113 which will be a source and/or a drain (S/D) is formed on a surface of a semiconductor substrate 101 including a P-type channel doped layer 109. Recesses 106 are formed on the semiconductor substrate 101 and the N-type diffusion layer 113. Source regions and drain regions of the N-type diffusion layer 113 are separated from one another by the recesses 106. A gate insulating film 107 is formed on an inner surface of each recess 106. A gate electrode 112 is buried onto each recess 106. The channel doped layer 109 is formed around the bottom portions of the recesses 106 and the side surfaces of the bottom portions.

The gate electrode 112 includes a DOPOS film 108, a tungsten film 110, and a gate nitride film 111. The DOPOS film 108 is partially buried onto the recess 106 through the gate insulating film 107. In this manner, the gate electrode 112 is formed between the source and the drain regions of the N-type diffusion layer 113 through the gate insulating film 107.

An inter-layer insulating film 115 is formed on the gate electrode 112. Cell contact poly-plugs 117 are formed on the N-type diffusion layer 113 between the gate electrodes 112 through gate-sidewall nitride films 114.

Thus, the gate electrode 112 is buried onto the recess 106. Thereby, an effective channel length can be controlled by the depth of the recess, and a higher threshold voltage Vth can be obtained compared with conventional planar semiconductor devices.

Methods of manufacturing a semiconductor device having the recess gate transistor structure are disclosed in, for example, Japanese Laid-open Patent Publication Nos. H06-5798, H08-78682, and H10-50992.

Typical processes are explained. As shown in FIG. 6A, the element isolation regions 102 are formed on the P-type semiconductor substrate 101 using the STI (shallow trench isolation) technique. Then, a pad oxide film, a nitride film, and a photoresist film (not shown) are formed on the semiconductor substrate 101. After the photoresist film is patterned by lithography so as to have openings at substantially the same positions as those of the gate electrodes 112, the nitride film is formed by dry etching.

After the photoresist film is removed, the semiconductor device 101 is etched with the nitride film as a mask to form the recesses 106. Then, the nitride film and the pad oxide film are removed, and the gate insulating film 107 is formed on the semiconductor substrate 101 and the inner surfaces of the recesses 106.

Then, the DOPOS film 108 as a gate electrode material is formed on the semiconductor substrate 101 and inside the recesses 106. Then, a non-depicted photoresist pattern having openings at the positions corresponding to those of memory cell regions is formed by lithography. In this state, an impurity, such as boron, is ion-implanted through the DOPOS film 108 to form the P-type channel doped layer 109 around the bottom portions of the recesses 106.

Then, the tungsten film 110 is formed by CVD or spattering as shown in FIG. 6B. Then, the gate nitride film (SiN film) 111 is formed by low pressure CVD. Then, a photoresist film (not shown) is formed by lithography so as to match the recesses 106.

Then, the gate nitride film 111, the tungsten film 110, and the DOPOS film 108 are sequentially etched by dry etching to form the gate electrode 112 as shown in FIG. 6C. In this state, a photoresist pattern having openings at the positions corresponding to those of the memory cell regions is formed, and an impurity, such as phosphorus, is implanted so as to be doped only into the cell portions to form the N-type diffusion layer 113.

Then, the gate-sidewall nitride film 114 is formed. Then, the inter-layer insulating film 115 is formed. Then, contact holes 116 are formed on the inter-layer insulating film 115 by lithography and dry etching so that the source and drain regions (the N-type diffusion layer 113) are exposed. The cell-contact poly plugs 117 are formed by DOPOS film formation and polysilicon CMP. Thereby, the semiconductor device H1, as shown in FIG. 5, is completed.

SUMMARY OF THE INVENTION

According to one aspect of the present invention, there is provided a method of manufacturing a semiconductor device which may include forming a plurality of recesses in a semiconductor substrate, forming a gate insulating film in the plurality of recesses, and a plurality of gate electrodes on the gate insulating film in the plurality of recesses, forming an insulating layer on the semiconductor substrate and the plurality of gate electrodes, forming a plurality of contact holes in the insulating layer, the contact holes being formed between adjacent ones of the plurality of gate electrodes, implanting a first impurity into the semiconductor substrate through the plurality of contact holes to form each of source and drain regions in contact with the gate insulating film.

As a result, desired impurity profiles and desired device characteristics can be obtained by implanting an impurity into the semiconductor substrate through each of the cell contact holes to form each of source and drain regions without a specific lithography process. Therefore, one lithography process can be eliminated without deterioration in the characteristics of the transistor and the other devices, and therefore the manufacturing costs can be reduced.

According to another aspect of the present invention, there is provided a method of manufacturing a semiconductor device which may include selectively forming a recess in a semiconductor layer of a first conductivity type; forming a gate electrode structure to fill the recess with an intervention of a gate insulating film and protrude from a surface of the semiconductor layer; forming a sidewall insulating film on a side surface of the gate electrode structure; introducing an impurity indicative of a second conductivity type by using the sidewall insulating film as a part of a mask; and forming an impurity region of the second conductivity type in the semiconductor layer by use of the impurity.

As a result, desired impurity profiles and desired device characteristics can be obtained by more simplified process flows, and therefore the manufacturing costs can be reduced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EXEMPLARY EMBODIMENTS

The invention will now be described herein with reference to illustrative embodiments. The accompanying drawings explain a semiconductor device and a method of manufacturing the semiconductor device in the embodiments, and the size, the thickness, and the like of each illustrated portion might be different from those of each portion of an actual semiconductor device.

Those skilled in the art will recognize that many alternative embodiments can be accomplished using the teachings of the present invention and that the invention is not limited to the embodiments illustrated herein for explanatory purpose.

First Embodiment

Referring now to FIGS. 1 to 4, the method of manufacturing the semiconductor device according to the first embodiment includes, in short, processes of: forming recesses on a semiconductor substrate (recess forming process); forming gate electrodes on the recesses after a gate insulating film is formed on inner surfaces of the recesses (gate-electrode forming process); forming an insulating film over the semiconductor substrate and the gate electrodes and then forming cell-contact holes on the insulating film (contact-hole forming process); forming a source-and-drain (S/D) diffusion layer on both sides of each recess (S/D-diffusion-layer forming process); and forming a channel doped layer around the bottom surfaces of the recesses (channel-doped-layer forming process).

Figure 1A:
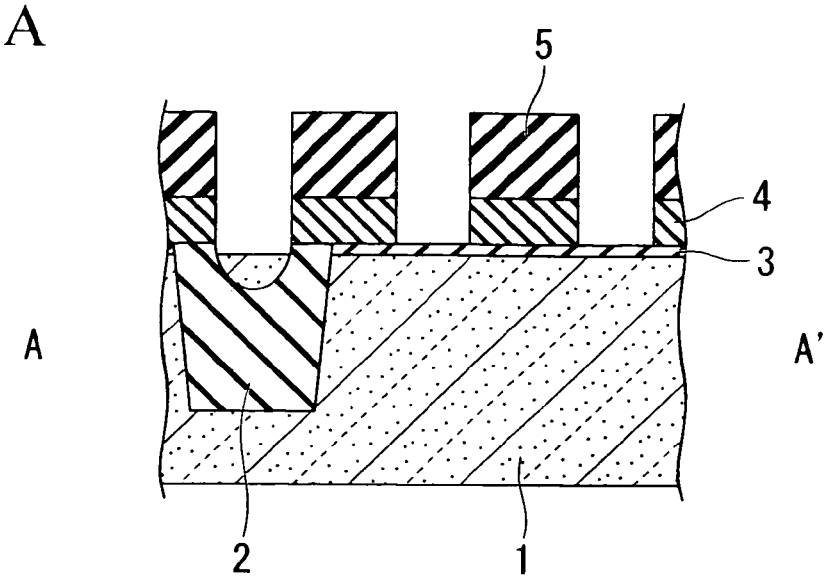
FIGS. 1A to 1C, 2A to 2C, and 3A to 3C are cross sectional views indicative of schematic process flow showing a method of manufacturing a semiconductor device according to a first embodiment of the present invention.

Specifically, in the recess forming process, an element isolation region 2 of, for example, approximately 300 nm in depth is formed on a P-type semiconductor substrate 1 by STI (shallow trench isolation) as shown in FIG. 1A. Then, a pad oxide film 3 of, for example, approximately 20 nm is formed by thermal oxidation. Further, a silicon nitride film 4 of approximately 100 nm is deposited by CVD (chemical vapor deposition), and then a photoresist film 5 is deposited thereon.

Figure 4A:
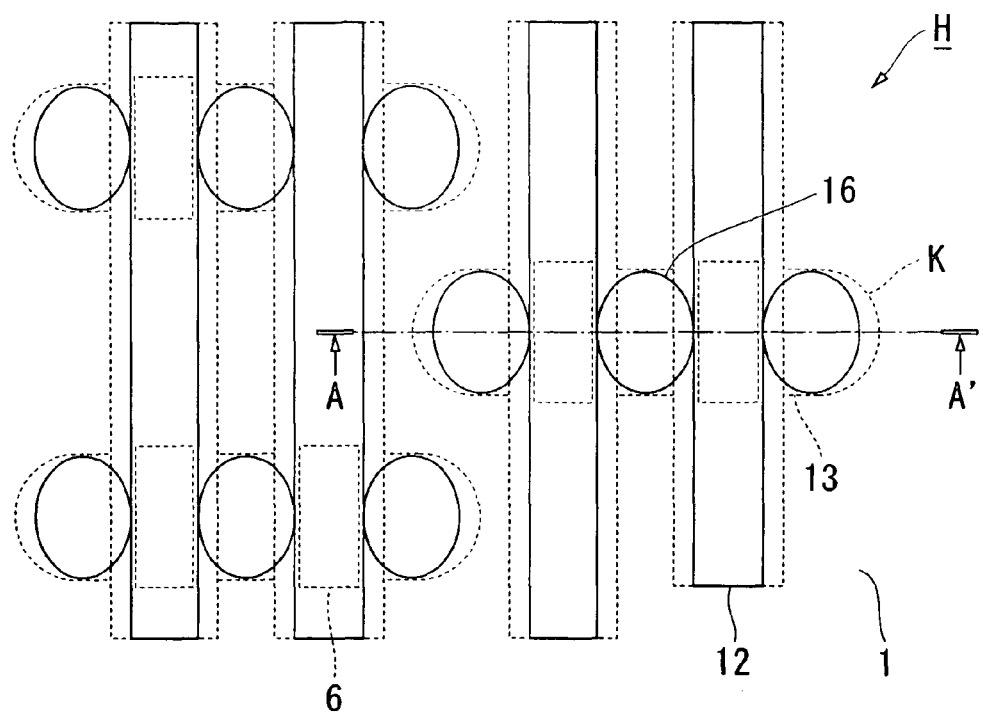
FIG. 4A is a plane view of the semiconductor device according to the first embodiment.

Then, the photoresist film 5 is patterned by lithography so as to have openings at positions corresponding to those of the gate electrodes 12 shown in FIG. 4A. Then, the nitride film 4 is selectively removed by dry etching.

Figure 1B:
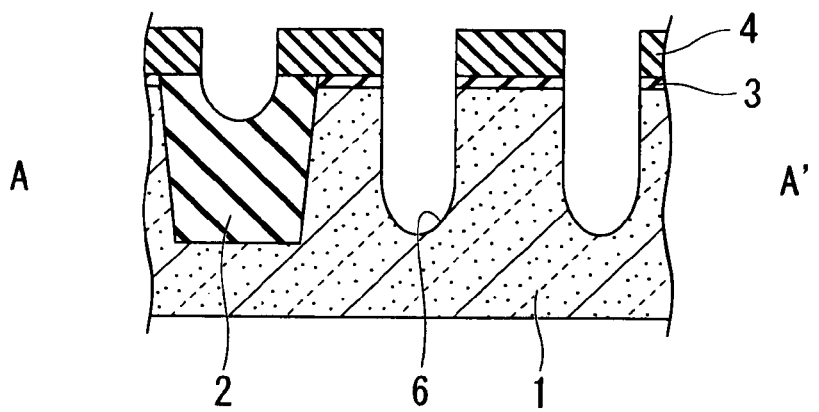

After the photoresist film 5 is removed as shown in FIG. 1B, the semiconductor substrate 1 is etched with the nitride film 4 as a mask to form recesses (silicon recesses) 6 of, for example, approximately 90 nm in width and 150 nm in depth.

Figure 1C:
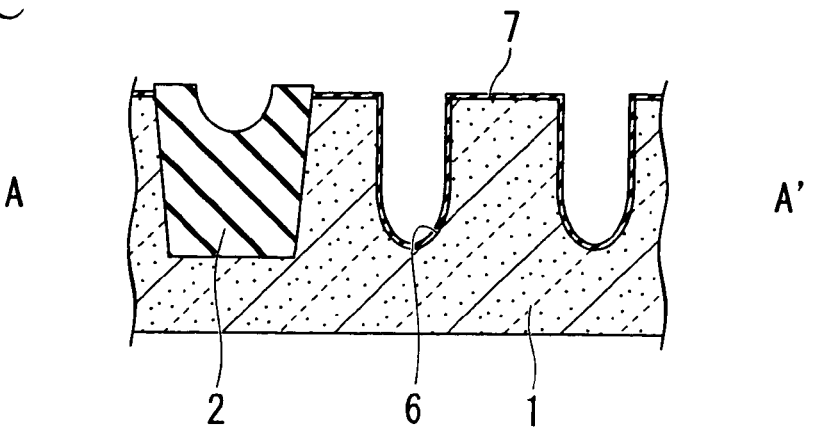

In the gate-electrode forming process, the nitride film 4 and the pad oxide film 3 are removed using a solution which includes hydrofluoric acid, followed by forming a silicon oxide film 7 of, for example, approximately 6 nm as a gate insulating film 7 on the semiconductor substrate 1 by thermal oxidation, as shown in FIG. 1C.

Figure 2A:
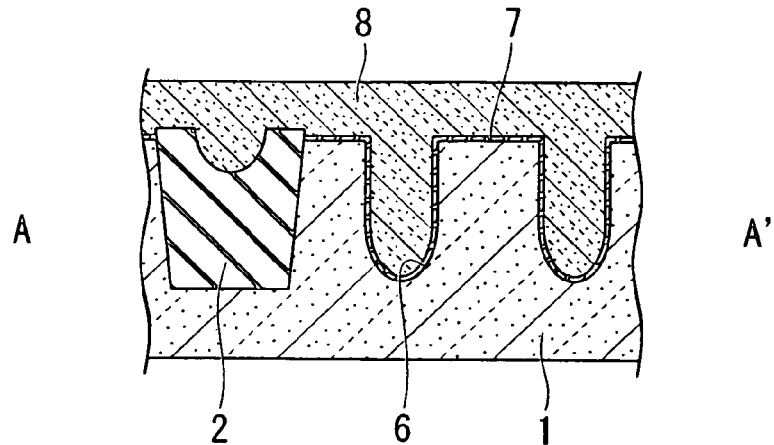

Then, a doped-polysilicon or DOPOS film (having a phosphorus concentration of, for example, 2e20 $cm^{-3}$) of, for example, approximately 100 nm is formed as a gate electrode material to form a gate DOPOS film 8, as shown in FIG. 2A.

Figure 2B:
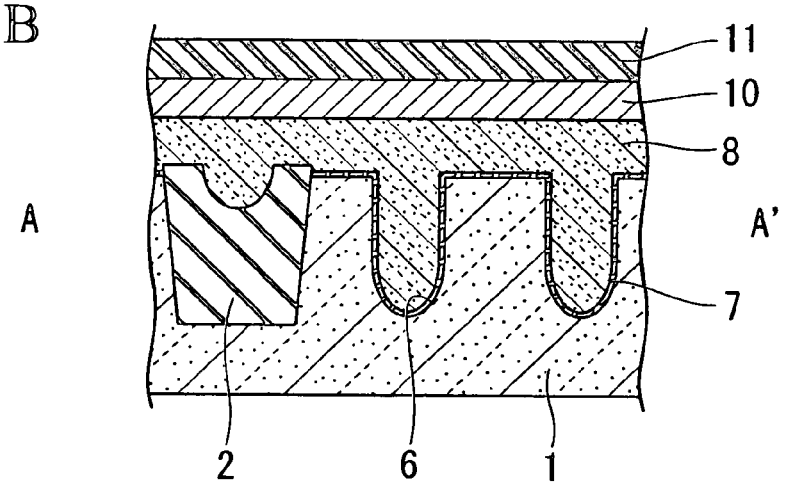

Then, a tungsten film 10 of, for example, approximately 50 nm is formed by CVD or spattering, as shown in FIG. 2B. Then, a silicon nitride film (SiN film) 11 of, for example, approximately 150 nm is formed by low pressure CVD.

Figure 2C:
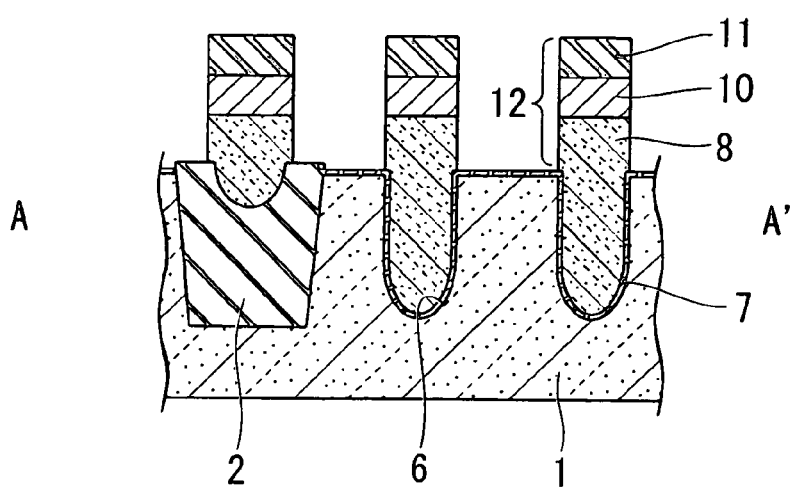

Then, a photoresist film (not shown) is formed to match the recesses 6 by lithography, and then the silicon nitride film 11, the gate tungsten film 10, and the gate DOPOS film 8 are sequentially etched by dry etching to form a gate electrode 12 as shown in FIG. 2C.

Figure 3A:
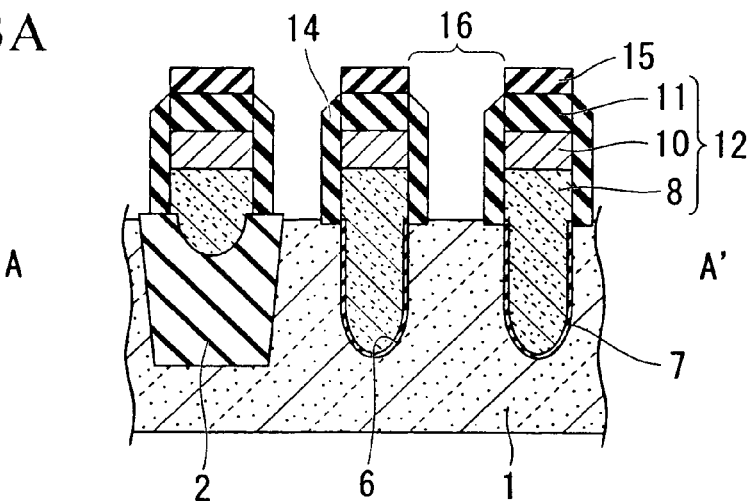

Then, a silicon nitride film of, for example, approximately 40 nm is formed by CVD, followed by etching back to form a gate-sidewall nitride film 14 as shown in FIG. 3A.

In the contact-hole forming process, an inter-layer insulating film 15, such as BPSG, of approximately 500 nm is formed, reflowed by being annealed in a nitrogenous atmosphere at, for example, 750 to 900° C., and then planarized by a CMP process.

Further, contacts are formed at cell active portions K shown in FIG. 4A to form cell contact holes 16. The cell contact holes 16 are formed on the inter-layer insulating film 15 and on both sides of each gate electrode 12. The gate-sidewall nitride film 14 remains to form a part of each contact hole 16.

Figure 3B:
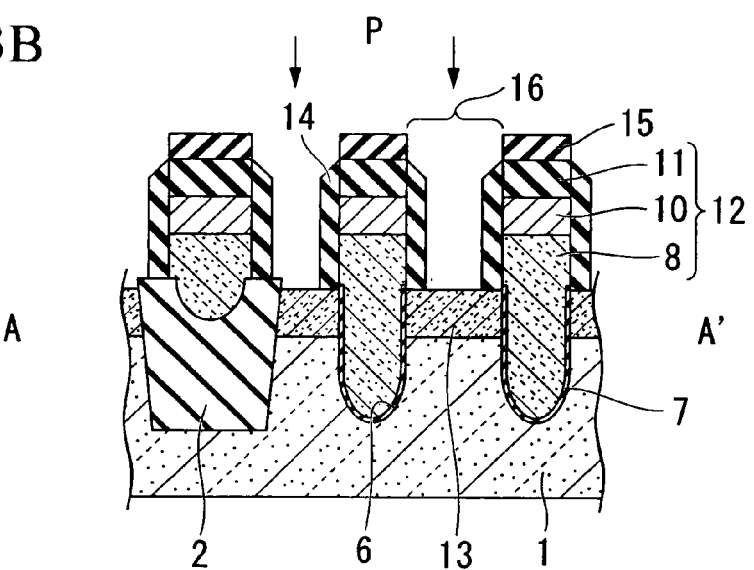

In the S/D-diffusion-layer forming process, a first impurity is implanted onto the entire surface of the wafer to form a diffusion layer 13 functioning as a source and/or a drain region, as shown in FIG. 3B. For example, phosphorus as the first impurity is preferably ion-implanted at energy in the range of 20 to 50 KeV and at a dose in the range of $1 \times 10^{13}$ $cm^{-2}$ to $1 \times 10^{14}$ $cm^{-2}$.

As a result, the first impurity is implanted into the active portions K in the memory cell through the contact holes 16, and the S/D diffusion layer 13 may be formed under the cell contact holes 16. In this regard, although the cell contact holes 16 are offset from the recess gates due to the gate-sidewall nitride film 14, the first impurity expands also in the direction parallel to the surface of the substrate 1 at the time of the ion-implantation and a thermal treatment carried out subsequently, so that the diffusion region 13 is formed in contact with the gate insulating film 6.

Since the cell contact holes 16 are provided only at desired portions in the memory cell and other portions are masked by the inter-layer insulating film 15, the first impurity can be implanted by self-alignment without adding another lithography process.

Figure 3C:
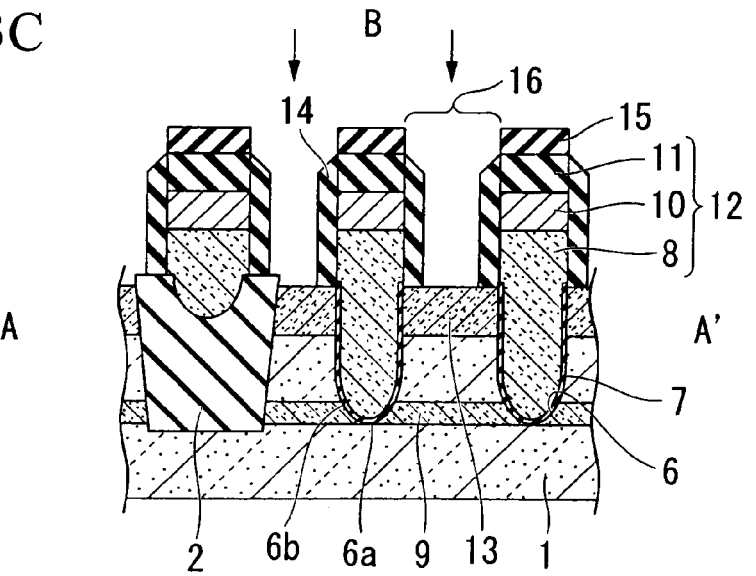

In the channel-doped-layer forming process, a second impurity is implanted onto the entire surface of the wafer to form a channel doped layer 9 as shown in FIG. 3C. For example, boron as the second impurity is preferably ion-implanted at energy in the range of 40 to 70 KeV and at a dose in the range of $1\times10^{12}$ cm$^{-2}$ to $5\times10^{13}$ cm$^{-2}$.

The channel doped layer 9 needs to be formed at the bottom portions 6a of the recesses 6 and the side surfaces 6b of the bottom portions 6a, and therefore is preferably aligned at a depth identical to that of the bottom portions 6a of the recesses 6 and formed by the second impurity being diffused toward the recesses 6 rather than the opening regions of the cell contact holes 16.

Although the second impurity is implanted in the downward direction of the contact holes 16 at this time, the second impurity is implanted at high energy. Thereby, the channel doped layer 9 extending widthwise to cover the bottom portions 6a of the recesses 6 and the side surfaces 6b of the bottom portions 6a can be formed, and a threshold voltage of the obtained transistor can be adjusted. It was confirmed in an actual device that desired threshold voltage characteristics can be obtained. While the second impurity (boron) is also implanted into the DOPOS layer 8 of the gate electrode 12, the layer 8 still represents the N-type since the second impurity is much lower in concentration than the first impurity (phosphorus) in the DOPOS layer 8.

Figure 4B:
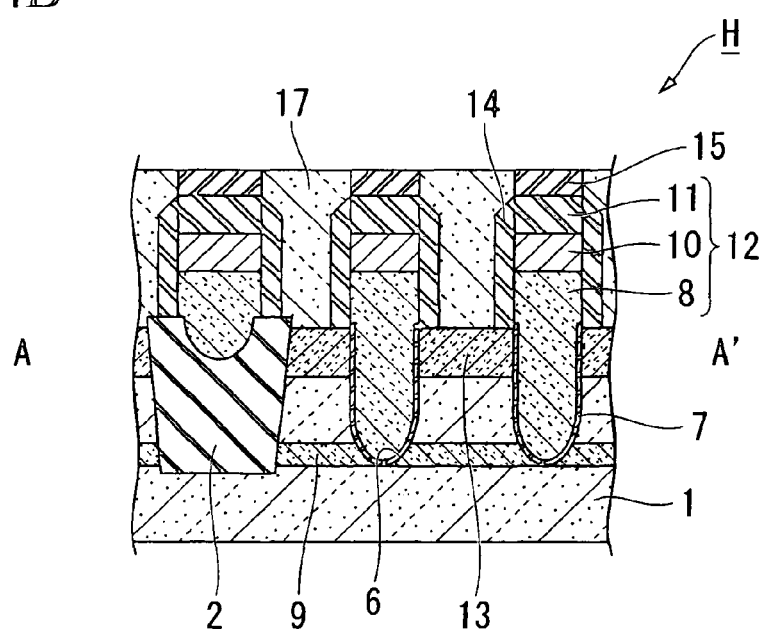
FIG. 4B is a cross-sectional view taken along a line A-A' shown in FIG. 4A.
Figure 5:
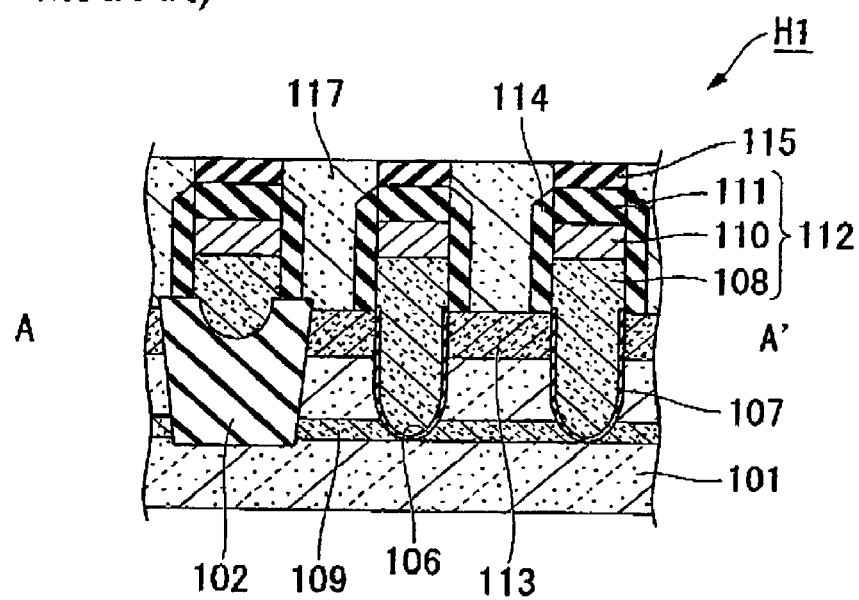
FIG. 5 is a cross-sectional view of a conventional semiconductor device.
Figure 6A:
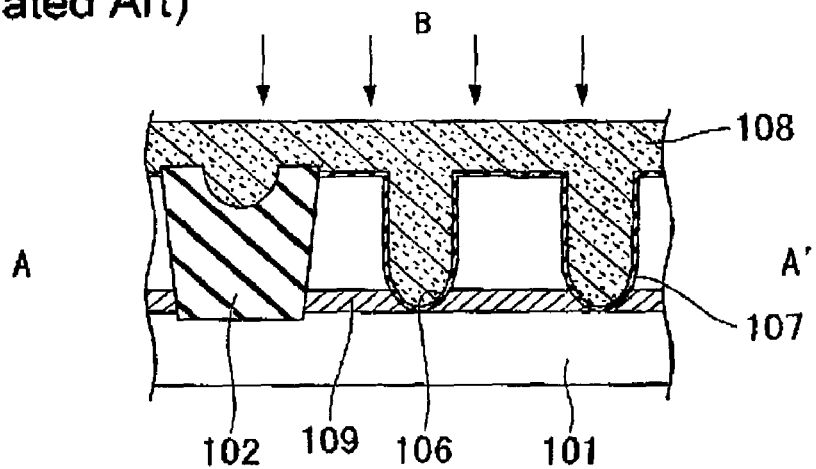
FIGS. 6A to 6C are cross sectional views indicative of the schematic process flow showing a method of manufacturing the conventional semiconductor device.
Figure 6B:
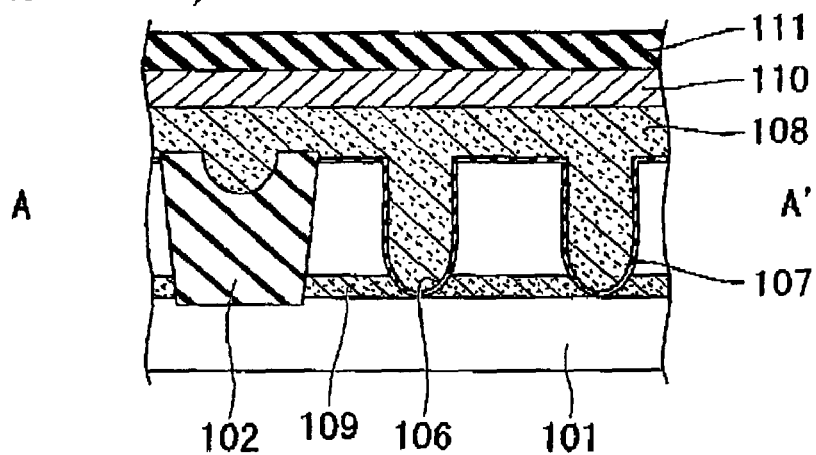
Figure 6C:
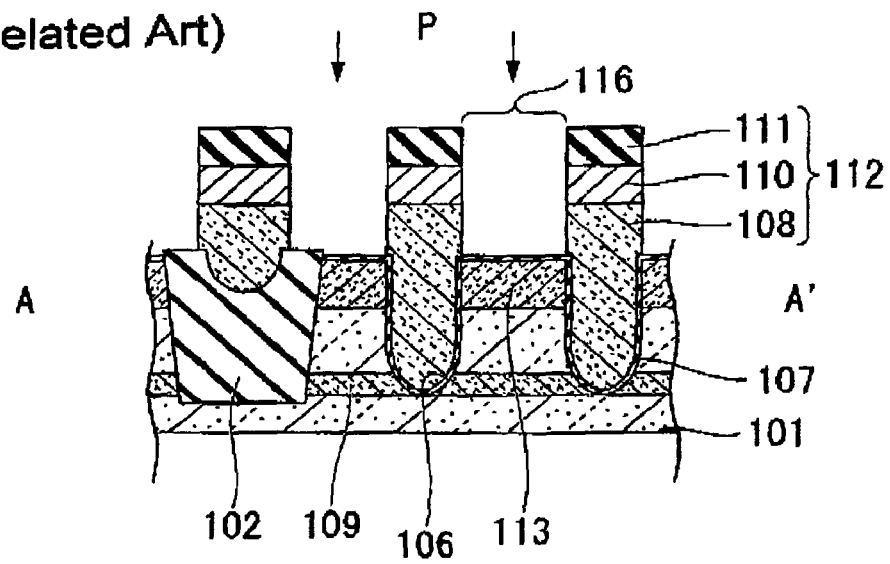

Then, as shown in FIG. 4B, cell-contact poly plugs 17 made of metal or polysilicon are formed. Then, various wirings, such as bit and word lines, a cell capacitor, an inter-layer insulating film, and the like may be formed using a general method. In this manner, a DRAM (semiconductor device) in which a recess gate transistor is used as a transfer gate transistor in a memory cell is completed.

Since an impurity is implanted into storage nodes, an increase in leakage at junctures caused by an increase in the concentration of the P-type substrate might be concerned. However, the second impurity to be the channel doped layer is doped in the range of the implantation energy into a region separated from PN junctures (>50 nm), i.e., a region deeper than the surface of the semiconductor device 1. Therefore, it was confirmed in an actual device that the refresh time which is a significant characteristic of the DRAM does not deteriorate.

As explained above, according to the method of manufacturing the semiconductor device of the first embodiment, desired impurity profiles and desired device characteristics can be obtained by implanting impurities to form the channel doped layer 9 and the S/D diffusion layer 13 without a specific lithography process after the cell contact holes 16 are provided. As a result, two lithography processes can be eliminated without deterioration in the characteristics of the transistor and the other devices, and therefore the manufacturing costs can be reduced by approximately 4% in total.

FIGS. 4A and 4B show a semiconductor device H manufactured by the above manufacturing method. The recess gate transistor (semiconductor device) H of the first embodiment includes the element isolation regions 2 on the surface of the semiconductor substrate 1. The element isolation regions 2 divide the semiconductor substrate 1 into multiple active portions K.

The recess gate transistor H mainly includes recesses 6 provided on the semiconductor substrate 1, the gate electrodes 12 formed on the recesses 6 through the gate insulating film 7, and the N-type S/D diffusion layer 13 formed between the recesses 6.

A non-depicted P-type well layer is provided at a portion deeper than the element isolation region 2. The P-type channel doped layer 9 is provided at a portion shallower than the P-type well layer. The S/D diffusion layer 13 is provided between a pair of the element isolation regions 2 and at a portion shallower than the P-type channel doped layer 9.

The recesses 6 are formed on the semiconductor substrate 1, between which the S/D diffusion layer 13 is provided. The bottom surface 6a and the sidewall 6b (e.g., see FIG. 3C) of the recess 6 are in contact with the channel doped layer 9 through the gate insulating film 7.

The gate insulating film 7 is provided on the surface of the semiconductor substrate 1 and following the recess 6.

The gate electrode 12 includes the DOPOS film 8, the tungsten film 10, and the gate nitride film 11. The DOPOS film 8 is partially buried onto the recess 6. The gate electrode 12 is arranged at the portion buried onto the recess 6 through the gate insulating film 7. The upper portion of the gate electrode 12 protrudes upwardly from the semiconductor substrate 1. The S/D diffusion layer 13 includes a source region and a drain region that are separated from each other by the recess 6.

In this manner, the gate electrode 12 is formed between the source and the drain regions of the S/D diffusion layer 13 through the gate insulating film 7. The inter-layer insulating film 15 is formed on the gate electrode 12. The cell-contact poly plugs 17 are formed on the S/D diffusion layer 13 and between the gate electrodes 12 through the gate-sidewall nitride film 14.

Various wirings, such as bit and word lines, a cell capacitor, an inter-layer insulating film, and the like are formed in the semiconductor device H having the recess-gate transistor structure. Thereby, a DRAM (semiconductor device) in which the recess-gate transistor is used as a transfer gate transistor in a memory cell is completed.

Second Embodiment

Next, a description will be made on the second embodiment of the present invention with reference to FIGS. 7A to 7G and FIG. 8.

Figure 7A:
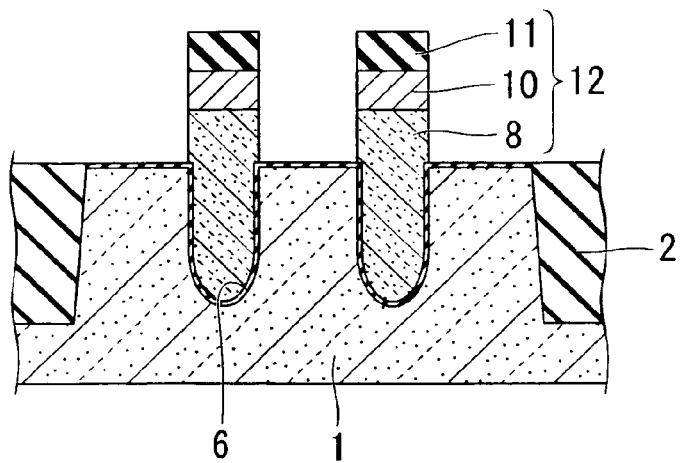
FIGS. 7A to 7G are cross sectional views indicative of the schematic process flow showing a method of manufacturing a semiconductor device according to a second embodiment of the present invention.

FIG. 7A corresponds to FIG. 2C, so that two recess gate structures 12, which include the gate insulating film 6, impurity-doped polysilicon layer 8, the metal layer 10, and the silicon nitride layer 11, are formed in an active region defined by STI region 2 selectively provided in the substrate (P-type semiconductor layer) 1 in accordance with the processes explained in conjunction with FIGS. 1A to 2C.

Figure 7B:
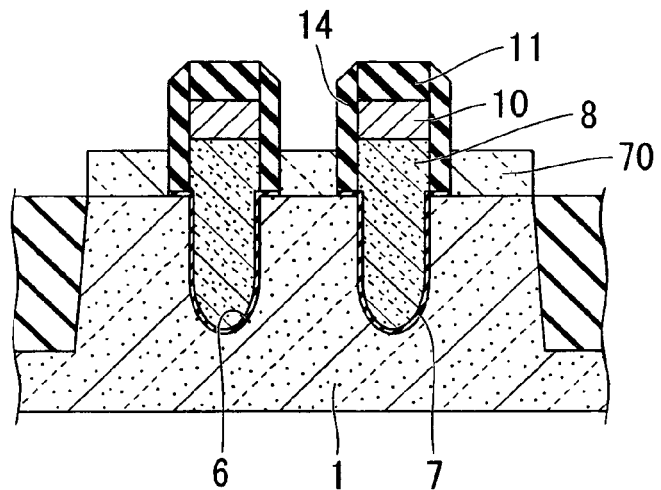

An insulating film made of, for example, a silicon nitride film is thereafter formed over the gate electrodes and the semiconductor substrate 1, and then etched back. Thereby, sidewall insulating films 14 are formed on both sides of each gate structure, as shown in FIG. 7B. At this time, respective parts of the gate insulating film 7, which had not been covered by the sidewall insulating films 14 and the gate structure, are removed to expose corresponding parts of the substrate 1. A selective epitaxial method is then carried out to form silicon epitaxial layers 70 on the exposed parts of the substrate 1

Figure 7C:
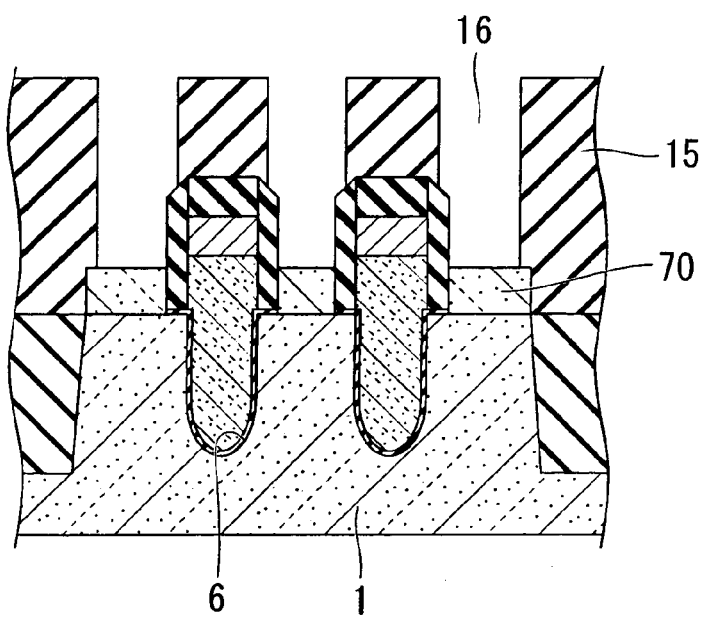
Figure 8:
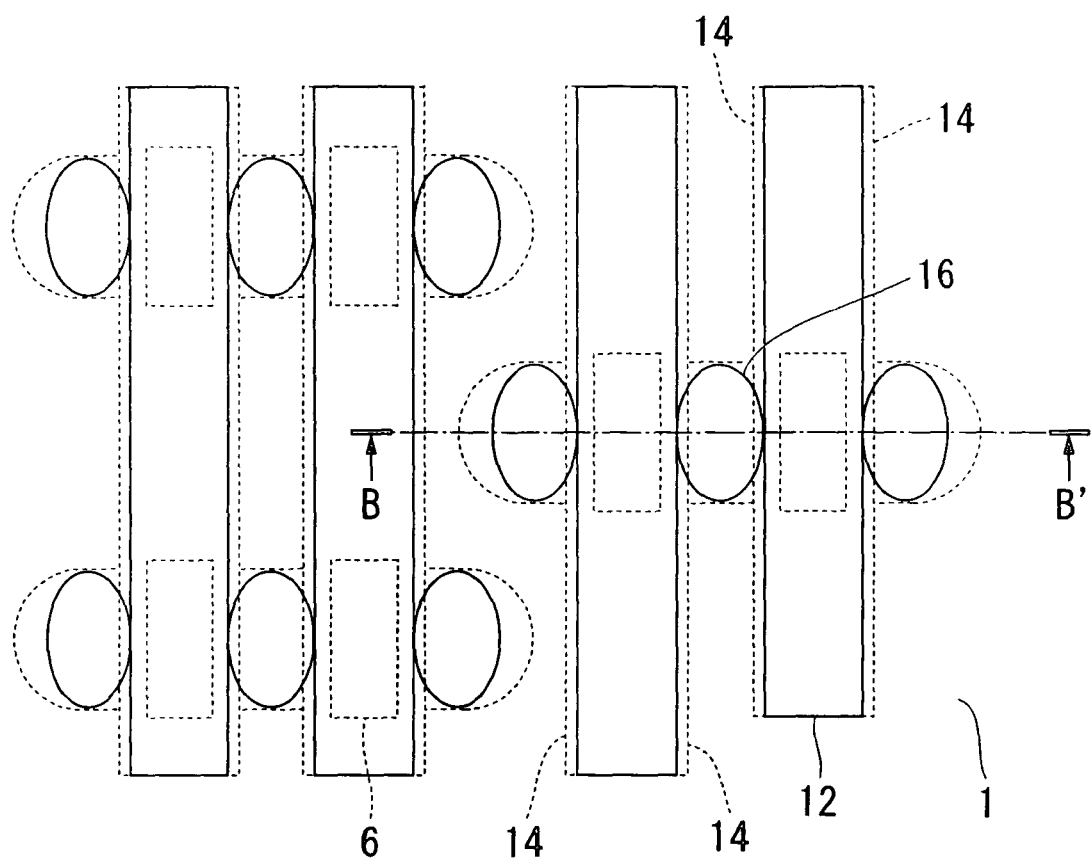
FIG. 8 is a plane view of the semiconductor device shown in FIG. 7C.

As shown in FIG. 7C, an inter-layer insulating film 15, such as a silicon oxide film, BPSG, and so on, is formed over the gate structures, the sidewalls 14, and the epitaxial layers 70, followed by forming contact holes 16 for a bit-line contact plug and capacitor contact plugs in the interlayer insulating layer 15, so that the respective surface parts of the sidewalls 14 and the silicon epitaxial layers 70 are exposed. Note that each contact hole 16 is formed in a shape as shown in FIG. 8.

Figure 7D:
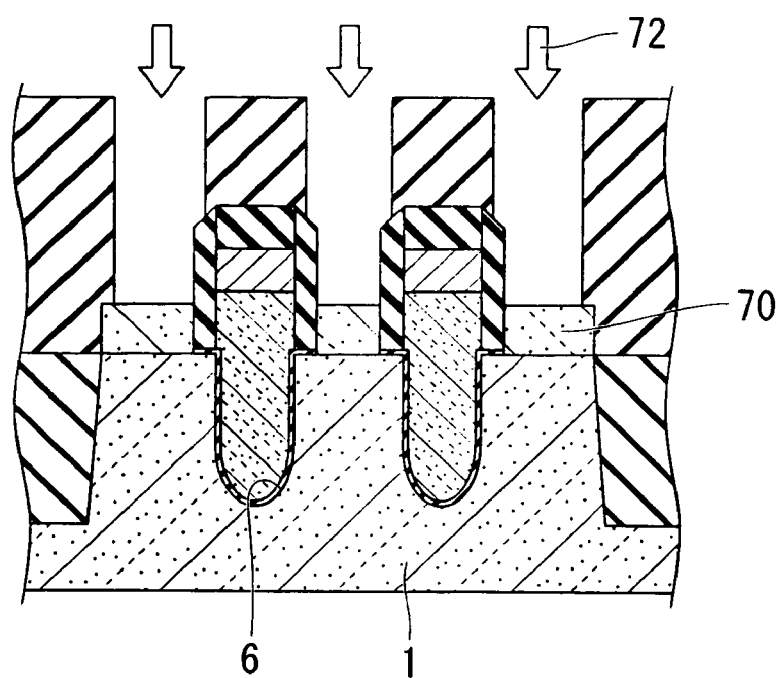
Figure 7E:
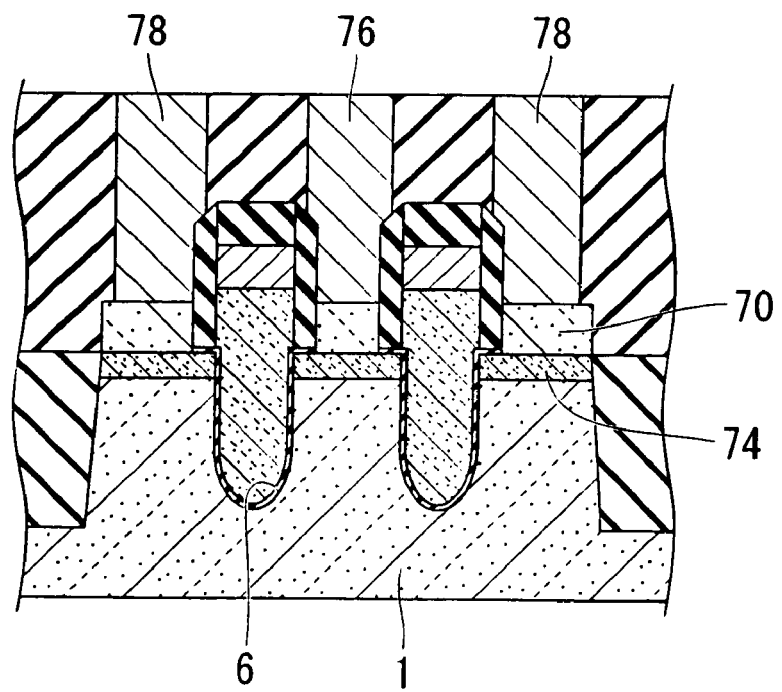
Figure 7F:
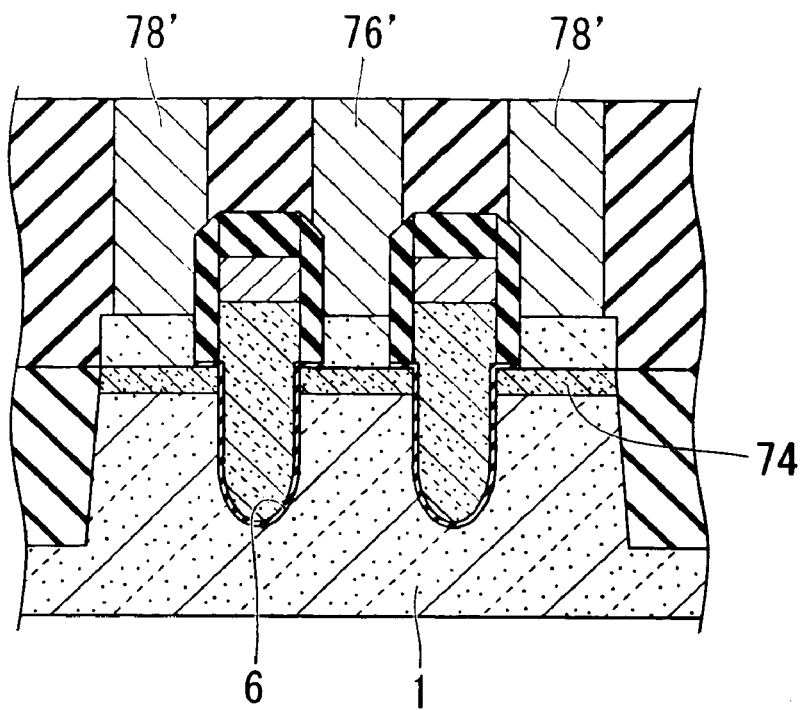

Turning to FIG. 7D, an N-type impurity, such as phosphorus, is ion-implanted into the silicon layer 70 through the contact hole 16 by using the inter-layer insulating film 15 and the sidewalls 14 as a mask, as indicated by arrows 72. Note that a part of the implanted impurities may reach the substrate 1 to form regions serving as source and drain regions. Further, similarly to the first embodiment, a channel doping process may be carried out to implant impurities representative of a P-type such as boron into a channel region (that is, around the bottom portions of the recesses) through the contact holes. This process may be done before or after the ion-implantation for the source and drain regions Each of the contact holes are then filled with DOPOS (impurity-doped polysilicon) layers, followed by planarization by CMP and annealing process. The source and drain regions 74, a bit contact plug 76, and capacitor contact plugs 78 are thereby formed as shown in FIG. 7E. In place of forming the DOPOS layers, annealing process is performed to activate the impurities for source and drain regions and a metal, such as tungsten, is deposited to fill the contact holes 16, so that tungsten plugs 76' and 78' are formed as shown in FIG. 7F.

Figure 7G:
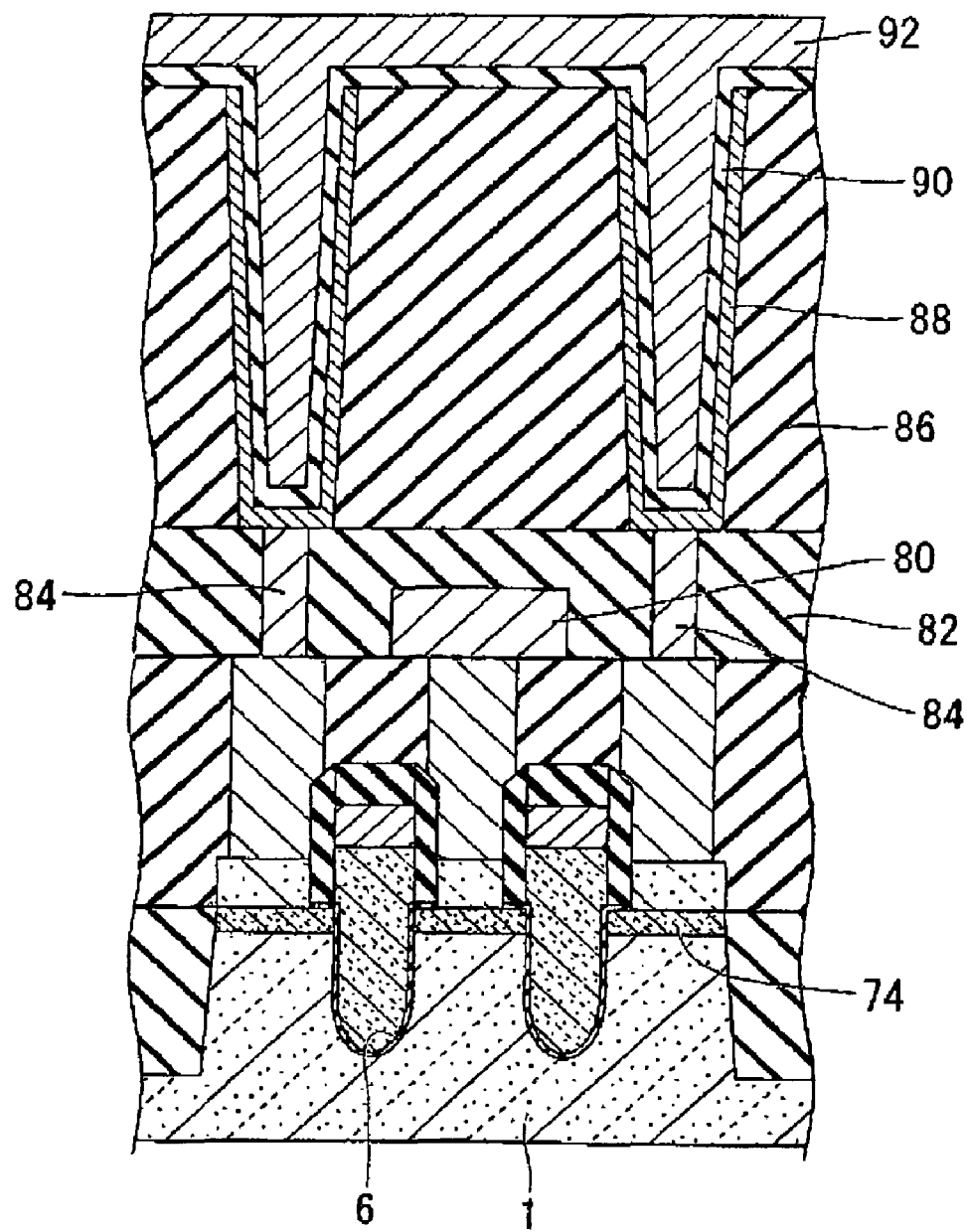

Referring to FIG. 7G, a bit line 80 is formed on the bit contact plug 76, and then a second inter-layer insulating film 82, such as a silicon oxide film, is deposited thereon. Second capacitor contact plugs 84 are thereafter formed in the second inter-layer insulating film 82 in contact with the capacitor contact plugs 78, followed by depositing an inter-layer insulating film 86, such as a silicon oxide film on the second inter-layer insulating film 82. Then, cylinder holes are formed in the third inter-layer insulating film 86, and a capacitor lower (storage) electrode 88, a capacitor dielectric (insulating) film 90, and a capacitor upper (plate) electrode 92 are sequentially formed on the cylinder holes, so that DRAM cell capacitors are formed.

As explained above, according to the method of manufacturing the semiconductor device of the second embodiment, desired impurity profiles and desired device characteristics can be obtained by more simplified process flows, and therefore the manufacturing costs can be reduced.

The present invention is widely used for general products using a DRAM cell and including embedded memories.

It is apparent that the present invention is not limited to the above embodiments, but may be modified and changed without departing from the scope and spirit of the invention.

What is claimed is:

1. A method of manufacturing a semiconductor device, comprising:
   forming recess in a semiconductor layer of a first conductivity type;
   forming a gate insulating film in said recess, and a gate electrode structure over said gate insulating film, the gate electrode structure filling the recess and protruding from a surface of the semiconductor layer;
   forming a sidewall insulating film on a side surface of the gate electrode structure;
   introducing an impurity indicative of a second conductivity conductivity type by using the sidewall insulating film as a part of a mask, to form an impurity region of the second conductivity type in the semiconductor layer;
   forming an inter-layer insulating film on the gate electrode structure and the sidewall insulating film; and
   forming a contact hole in the inter-layer insulating film to expose a part of the sidewall insulating film,
   wherein said implanting said impurity indicative of the second conductivity type is performed after said forming said contact hole, and
   wherein said implanting said impurity indicative of the second conductivity type comprises using the inter-layer insulating film as another part of the mask.

2. A method of manufacturing a semiconductor device, comprising;
   forming a plurality of recesses in a semiconductor substrate;
   forming a plurality of gate electrodes in the plurality of recesses;
   forming an insulating layer having a plurality contact holes on the semiconductor substrate;
   implanting a first impurity into the semiconductor substrate through said plurality of contact holes to form source and drain regions in the semiconductor substrate; and
   forming an inter-layer insulating film on the plurality of gate electrodes, said implanting said first impurity comprising using said inter-layer insulating film as a mask.

3. A method of manufacturing a semiconductor device, comprising:
   forming first and second recesses in a semiconductor substrate;
   forming first and second gate structures respectively in the first and second recesses with an intervention of a gate insulating film, each of the first and second gate structures including a portion protruding from the semiconductor substrate;
   forming a first sidewall insulating film on a side surface of the portion of the first gate structure and a second sidewall insulating film on a side surface of the portion of the second gate structure, the first and second sidewall insulating films thereby forming a gap therebetween;
   forming an interlayer insulating film over the semiconductor substrate, first and second gate structures and first and second sidewall insulating films with filling the gap between the first and second sidewall insulating films by the interlayer insulating film; selectively removing the interlayer insulating film to form a hole, the hole being thereby defined by a left portion of the interlayer insulating film and by at least one part of each of the first and second sidewall insulating films; and
   introducing impurities through the hole by using the left portion of interlayer insulating film as a pan of a mask and the at least one part of each of the first and second sidewall insulating films as another part of the mask, one of source and drain regions being formed in a portion of the semiconductor substrate between the first and second gate structures.

4. The method according to claim 1, further comprising:
   forming a silicon layer on the semiconductor layer in contact with the sidewall insulating film,
   wherein said introducing said impurity indicative of the second conductivity type comprises implanting said impurity into the silicon layer.

5. The method according to claim 1, further comprising:
   introducing an additional impurity indicative of the first conductivity type by using the sidewall insulating film as a part of a mask, to form a channel-doped region near a bottom portion of the recess.

6. The method according to claim 1, further comprising forming a capacitor having a first electrode electrically in contact with the impurity region, a second electrode, and a dielectric film formed between the first and second electrodes.

7. The method of claim 2, further comprising:
forming a gate insulating film in the plurality of recesses, said plurality of gate electrodes being formed on the gate insulating film and said source and drain regions being in contact with the gate insulating film,
wherein said plurality of contact holes are formed between adjacent gate electrodes in said plurality of gate electrodes.

8. The method of claim 2, further comprising:
implanting a second impurity into the semiconductor substrate through the plurality of Contact holes to form a channel-doped layer near a bottom portion of the plurality of recesses.

9. The method of claim 2, further comprising:
forming a sidewall film on the plurality of gate electrodes, said implanting said first impurity comprising using said sidewall film as a mask.

10. The method of claim 7, further comprising:
performing a thermal treatment to expand said implanted first impurity in a direction parallel to a surface of said substrate such that said source and drain regions are in contact with said gate insulating film.

11. The method of claim 8, wherein said implanting said first impurity comprises using a first energy, and said implanting said second impurity comprises using a second energy which is greater than said first energy.

12. The method as claimed in claim 3, wherein the hole is formed to expose an upper surface of the portion of the semiconductor substrate between the first and second gate structures, the impurities being introduced into the portion of the semiconductor substrate.

13. The method as claimed in claim 3, further comprising forming a semiconductor layer in the gap between the first and second sidewall insulating films before forming the interlayer insulating film so that the hole is formed to expose an upper surface of the semiconductor layer and the impurities are introduced into the semiconductor layer.

14. The methods as claimed in claim 3, wherein a part of the hole defined by the left portion of the interlayer insulating film is larger than another part of the hole defined by the at least one part of each of the first and second sidewall insulating films.

15. The method as claimed in claim 12, further comprising introducing additional impurities trough the hole to form a channel doping region around a bottom of each of the recesses.

16. The method as claimed in claim 13, further comprising introducing additional impurities through the hole to form a channel doping region around a bottom of each of the recesses.

17. The method as claimed in claim 13, wherein the semiconductor layer is formed by a selective epitaxial method.

18. The method as claimed in claim 15, wherein the impurities represent a conductivity type opposite to a conductivity type of the semiconductor substrate and the additional impurities represent a conductivity type equal to the conductivity type of the semiconductor substrate.

19. The method as claimed in claim 16, wherein the impurities represent a conductivity type opposite to a conductivity type of the semiconductor substrate and the additional impurities represent a conductivity type equal to the conductivity type of the semiconductor substrate.

* * * * *